United States Patent
Lang et al.

(10) Patent No.: US 6,849,562 B2
(45) Date of Patent: Feb. 1, 2005

(54) METHOD OF DEPOSITING A LOW K DIELECTRIC BARRIER FILM FOR COPPER DAMASCENE APPLICATION

(75) Inventors: Chi-I Lang, Sunnyvale, CA (US); Li-Qun Xia, Santa Clara, CA (US); Ping Xu, Fremont, CA (US); Louis Yang, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 271 days.

(21) Appl. No.: 10/092,203

(22) Filed: Mar. 4, 2002

(65) Prior Publication Data

US 2003/0165618 A1 Sep. 4, 2003

(51) Int. Cl.$^7$ .................. H01L 21/31; H01L 21/469
(52) U.S. Cl. .................. 438/778; 438/780; 438/786; 438/788; 438/789; 438/790; 438/791; 438/792; 438/793; 438/794; 257/758; 257/759; 257/760
(58) Field of Search .................. 438/778, 780, 438/786, 788–794; 257/758–760

(56) References Cited

U.S. PATENT DOCUMENTS

| | | | |
|---|---|---|---|
| 4,863,755 A | * 9/1989 | Hess et al. .................. 427/574 |
| 5,465,680 A | 11/1995 | Loboda .................. 117/84 |
| 5,541,037 A | 7/1996 | Hatakeyama et al. |
| 5,711,987 A | 1/1998 | Bearinger et al. .................. 427/7 |
| 5,818,071 A | 10/1998 | Loboda et al. .................. 257/77 |
| 5,989,998 A | 11/1999 | Sugahara et al. .................. 438/623 |
| 6,051,321 A | 4/2000 | Lee et al. .................. 428/447 |
| 6,147,009 A | 11/2000 | Grill et al. .................. 438/780 |
| 6,159,871 A | 12/2000 | Loboda et al. .................. 438/786 |
| 6,287,990 B1 | 9/2001 | Cheung et al. .................. 438/780 |
| 6,312,793 B1 | 11/2001 | Grill et al. .................. 428/312.6 |
| 6,417,092 B1 | 7/2002 | Jain et al. |
| 6,436,824 B1 | 8/2002 | Chooi et al. |
| 6,444,568 B1 | 9/2002 | Sundararajan et al. |
| 6,462,371 B1 | 10/2002 | Weimer et al. .................. 257/306 |
| 6,537,733 B2 | 3/2003 | Campana et al. |
| 6,630,413 B2 | 10/2003 | Todd |
| 2001/0046792 A1 | 11/2001 | Takahashi et al. |
| 2002/0016084 A1 * | 2/2002 | Todd .................. 438/791 |
| 2003/0020108 A1 | 1/2003 | Weimer et al. .................. 257/296 |
| 2003/0077916 A1 * | 4/2003 | Xu et al. .................. 438/778 |
| 2004/0018750 A1 * | 1/2004 | Sophie et al. .................. 438/792 |

OTHER PUBLICATIONS

Huang, et al., U.S. Appl. No. 09/902,518, filed Jul. 10, 2001, "Method and Apparatus for Treating Low k Dielectric Layers to Reduce Diffusion".

Campana, et al., U.S. Appl. No. 09/793,818, filed Feb. 23, 2001, "Method of Depositing Low Dielectric Constant Silicon Carbide Layers".

Nemani, et al., U.S. Appl. No. 09/627,667, filed Jul. 28, 2000, "Method of Depositing Dielectric Films".

* cited by examiner

*Primary Examiner*—Lynne A. Gurley
(74) *Attorney, Agent, or Firm*—Moser, Patterson & Sheridan

(57) ABSTRACT

A method for depositing a low k dielectric film comprising silicon, carbon, and nitrogen is provided. The low k dielectric film is formed by a gas mixture comprising a silicon source, a carbon source, and $NR_1R_2R_3$, wherein $R_1$, $R_2$, and $R_3$ are selected from the group consisting of alkyl and phenyl groups. The low k dielectric film may be used as a barrier layer, an etch stop, an anti-reflective coating, or a hard mask.

20 Claims, 1 Drawing Sheet

METHOD OF DEPOSITING A LOW K DIELECTRIC BARRIER FILM FOR COPPER DAMASCENE APPLICATION

BACKGROUND OF THE INVENTION

1. Field of the Invention

The present invention generally relates to low k dielectric materials. More particularly, the invention relates to a process of depositing low k dielectric layers on a substrate.

2. Description of the Related Art

Integrated circuits with sub-micron features that are densely spaced on substrates have been created as the result of improvements in integrated circuit design and fabrication. The increasingly smaller features used on integrated circuits have increased the importance of reducing the dielectric constant of the many layers typically used in recent integrated circuits and reducing the capacitive coupling between features such as interconnect lines. Using materials in the insulating and non-conductive layers of integrated circuits which have a low k (dielectric constant<4.0) is one method of addressing these two concerns.

Several characteristics of known low k materials make them undesirable for use in semiconductor devices. Some low k materials, such as parylene, do not withstand the high temperatures used in processing substrates to make semiconductor devices. Other low k materials, such as porous silicon oxides, do not serve as effective barrier layers which are needed to prevent the diffusion of materials, such as water and metal ions between conductive and insulating layers of a semiconductor device. Some low k materials have been created by including dopants, such as fluorine, in a higher k film. However, the use of dopants may result in chemical bonds in the film which expose or damage photoresist materials that may be placed on top of the film in order to etch the substrate using photolithography.

Low k materials are also desirable for layers besides barrier layers. The dielectric constant of each layer in a substrate is important because each layer contributes to the overall dielectric constant of the device. Examples of other layers which preferably have a low k are etch stop layers, anti-reflective coatings, and hard masks.

Etch stop materials are typically materials that have a slower etching rate compared to a dielectric layer that is deposited on the etch stop.

Anti-reflective coatings are layers that are used to prevent reflections between substrate layers. Such reflections can reach and expose portions of the photoresists used in photolithography to etch substrates. Such unwanted exposure of photoresists results in unwanted substrate patterning.

Hard masks are masks which are used to pattern substrates. The hard masks are typically left as a layer of the substrate after they have been used for patterning.

There remains a need for a process to make low k materials which can be used as effective barrier layers, etch stop layers, anti-reflective coatings, and/or hard masks. Furthermore, there remains a need for low k materials which do not damage photoresist materials.

SUMMARY OF THE INVENTION

The present invention generally provides low dielectric constant films and a method and apparatus for depositing low dielectric constant films. The method for depositing a low dielectric constant film on a substrate comprises providing a gas mixture to a deposition chamber, wherein the gas mixture comprises a silicon source, a carbon source, and $NR_1R_2R_3$, wherein $R_1$, $R_2$, and $R_3$ are selected from the group consisting of alkyl and phenyl groups, and reacting the gas mixture while applying radio frequency (RF) power to form a nitrogen-containing silicon carbide layer on the substrate in the chamber. The gas mixture may also comprise an inert gas. The silicon source and the carbon source may be separate compounds or an organosilicon compound. In a preferred embodiment, the organosilicon compound has the general formula $Si_xC_yH_z$, wherein x has a range of 1 to 2, y has a range of 1 to 6, and z has a range of 4 to 18. A preferred nitrogen source having the formula $NR_1R_2R_3$ is trimethylamine.

The low dielectric constant films described herein can be used as barrier layers, etch stops, anti-reflective coatings, and/or hard masks.

BRIEF DESCRIPTION OF THE DRAWINGS

So that the manner in which the aspects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
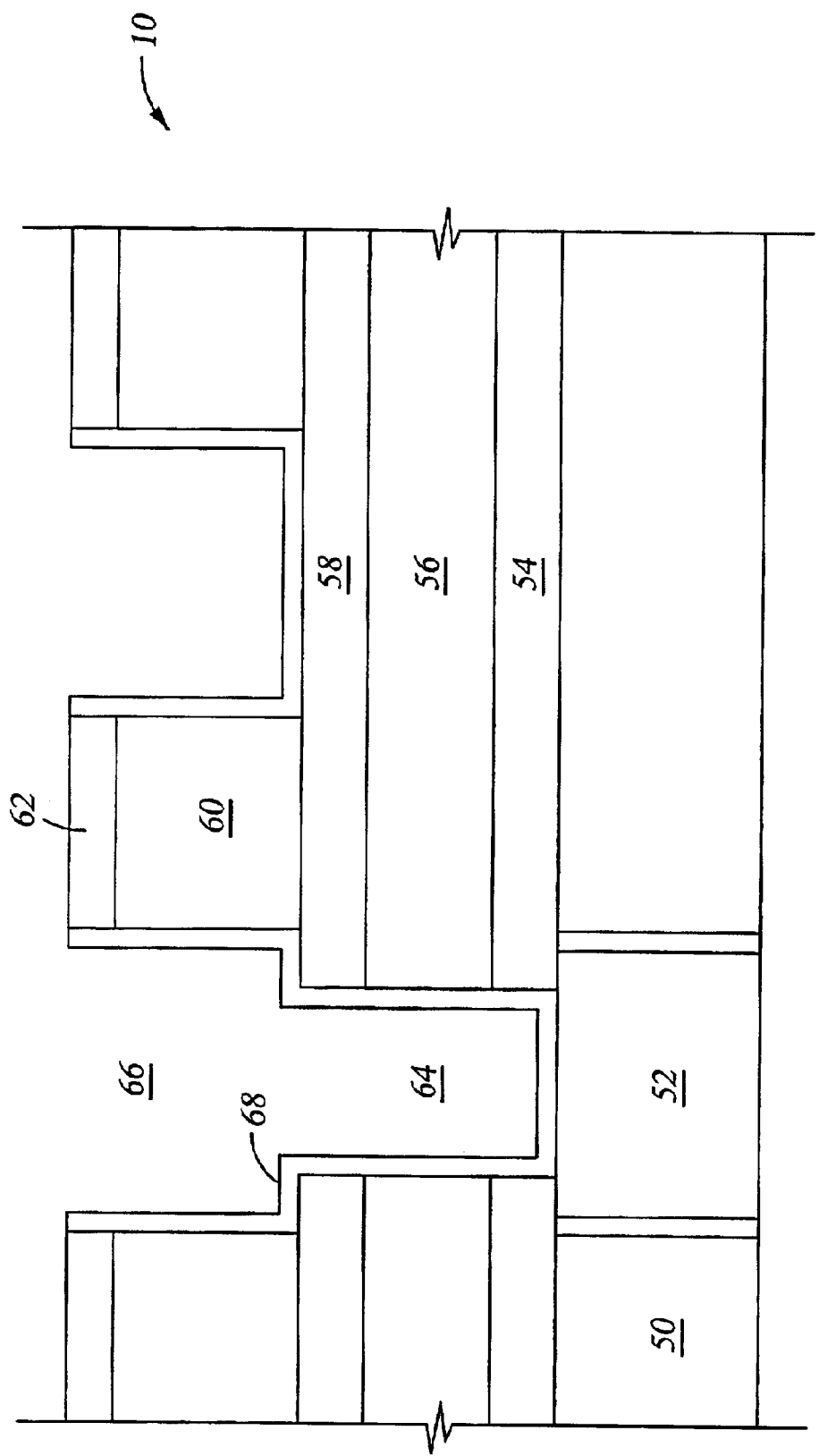
FIG. 1 is a schematic of a damascene structure using the low k dielectric film of the present invention as a barrier layer, an etch stop, and as an antireflective coating or a hard mask.

In one aspect, the invention provides a low k dielectric film and a method for making a low k dielectric film. The low k dielectric film is formed by reacting a gas mixture including a silicon source, a carbon source, and a nitrogen source which has the formula $NR_1R_2R_3$. The silicon source and the carbon source may be separate compounds or an organosilicon compound. In one embodiment, the organosilicon compound may have the general formula $Si_xC_yH_z$, where x has a range from 1 to 2, y has a range from 1 to 6, and z has a range from 4 to 18. For example, methylsilane ($SiCH_6$), dimethylsilane ($SiC_2H_8$), trimethylsilane ($SiC_3H_{10}$), tetramethylsilane ($SiC_4H_{12}$), and diethylsilane ($SiC_4H_{12}$), among others may be used as the organosilicon compound. Alternatively, silane ($SiH_4$) or disilane ($Si_2H_6$) and methane ($CH_4$) or other hydrocarbons may be used as the silicon source and the carbon source. A preferred silicon source and carbon source is trimethylsilane.

In another embodiment, suitable organosilicon compounds include cyclic organosilicon compounds. Cyclic organosilicon compounds typically have a ring comprising three or more silicon atoms. Examples of cyclic organosilicon compounds are 1,3,5-trisilano-2,4,6-trimethylene, 1,3,5,7-tetramethyl cyclotetrasiloxane, and octamethylcyclotetrasiloxane.

The above lists are illustrative and should not be construed or interpreted as limiting the scope of the invention.

The low k dielectric films created from the materials described above are generally nitrogen-containing silicon carbide layers. However, the low k dielectric films may also contain oxygen, depending on the choice of the materials in the gas mixture.

The silicon source and carbon source discussed above are reacted with a nitrogen source having the formula $NR_1R_2R_3$, wherein $R_1$, $R_2$, and $R_3$ are selected from the group consisting of alkyl and phenyl groups. There are no N—H bonds in $NR_1R_2R_3$ when each R is an alkyl or phenyl group. Furthermore, by using R groups such as alkyls and phenyls which are bulkier than hydrogens, the nitrogen is more sterically hindered, and thus, it is unlikely that N—H bonds will be formed in the film between the nitrogen of the $NR_1R_2R_3$ and hydrogen from other components in the film. It is believed that N—H bonds contribute to the poisoning of photoresist material. For example, some energy sensitive resist materials (e. g., Shipley UV5 deep UV resist, JSR M20G deep UV resist) react with moisture to form amino basic groups ($NH_2^-$), that may cause photoresist "footing" (i. e., a widening of the developed resist feature at its base) on material layers having nitrogen incorporated therein. Thus, it is believed that these low k dielectric films that include nitrogen from $NR_1R_2R_3$ instead of a source such as ammonia, which has N—H bonds, cause no or reduced damage to photoresist materials that are placed in contact with these low k dielectric films. Also, the presence of more organic bonds, such as the N—C bonds in $NR_1R_2R_3$ instead of inorganic bonds, such as the N—H bonds in ammonia, may make these low k dielectric films more compatible with photoresist materials, which are typically organic materials.

In addition to causing less damage to photoresists, other advantages of these low k dielectric films include good thermal stability and lower k values than many currently used low k dielectric films. Good thermal stability lowers the probability that the dielectric film will be damaged during semiconductor device processing, which can involve high temperatures. Lower k values can reduce unwanted capacitive coupling and increase the speed of circuits containing these films.

Nitrogen incorporation is believed to improve the silicon carbide layer by forming silicon-nitrogen bonds and/or carbon-nitrogen-silicon bonds. Silicon-nitrogen bonds and/or carbon-silicon-nitrogen bonds require larger activation energies to propagate cracks than do silicon-carbon bonds. Nitrogen incorporation may also stabilize the layer in that it becomes less reactive with moisture (e.g., hydrophobic) and/or oxygen under atmospheric conditions.

The low k dielectric films described herein can be formed by reacting a gas mixture including the silicon source, the carbon source, and the nitrogen source which has the formula $NR_1R_2R_3$ while applying single or mixed radio frequency (RF) power in a CVD plasma reactor. The gas mixture may further comprise an oxygen source and/or an inert gas. Oxygen, carbon dioxide, or combinations thereof, can be used for the oxygen source. Helium (He), argon (Ar), neon (Ne), or combination thereof, among others, may be used for the inert gas. An example of a CVD plamsa reactor which can be used is described in U.S. Pat. No. 6,287,990 B1, entitled "CVD Plasma Assisted Low k Dielectric Constant Films," which is incorporated by reference herein.

Plasma enhanced chemical vapor deposition (PECVD) techniques promote excitation and/or disassociation of the reactant gases by the application of the electric field to a reaction zone near the substrate surface, creating a plasma of reactive species. The reactivity of the species in the plasma reduces the energy required for a chemical reaction to take place, in effect lowering the required temperature for such PECVD processes.

In general, the following deposition process parameters can be used to form the low k dielectric film. The process parameters range from a substrate temperature of about 150° C. to about 450° C., a chamber pressure of about 1 torr to about 15 torr, a combined silicon source and carbon source flow rate of about 10 sccm to about 2,000 sccm, a nitrogen source flow rate of about 50 sccm to about 10,000 sccm, an inert gas flow rate of less than about 1000 sccm, an oxygen source gas flow rate less than about 500 sccm, a plate spacing of about 200 mils to about 600 mils, and an RF power of about 1 watt/cm$^2$ to about 10 watts/cm$^2$ (for either the single RF or a total RF power for the mixed RF frequencies). Additionally, the ratio of the silicon source to the nitrogen source in the gas mixture should have a range of about 1:1 to about 1:100. The above process parameters provide a deposition rate for the silicon carbide layer in a range of about 100 Å/min to about 3000 Å/min when implemented on a 200 mm (millimeter) substrate in a DxZ™ deposition chamber available from Applied Materials, Inc., located in Santa Clara, Calif., Other deposition chambers are within the scope of the invention, and the parameters listed above may vary according to the particular deposition chamber used to form the silicon carbide layer. For example, other deposition chambers may have a larger (e. g., configured to accommodate 300 mm substrates) or smaller volume, requiring gas flow rates that are larger or smaller than those recited for deposition chambers available from Applied Materials Inc., Santa Clara, Calif.

The reaction conditions and reactors discussed above may be controlled by a central processing unit. The central processing unit (CPU) may be one of any form of general purpose computer processor that can be used in an industrial setting for controlling process chambers as well as sub-processors. The computer may use any suitable memory, such as random access memory, read only memory, floppy disk drive, hard drive, or any other form of digital storage, local or remote. Various support circuits may be coupled to the CPU for supporting the processor in a conventional manner. Process sequence routines as required may be stored in the memory or executed by a second CPU that is remotely located.

The process sequence routines, when executed, transform the general purpose computer into a specific process computer that controls the chamber operation so that the deposition process is performed. Alternatively, the chamber operation may be controlled using remotely located hardware, as an application specific integrated circuit or other type of hardware implementation, or a combination of software and hardware.

The low k dielectric films deposited by the processes described above can be used as barrier layers, etch stops, anti-reflective coatings, and/or hard masks. The low k dielectric films, which are nitrogen-containing silicon carbide layers, will have dielectric constants which are less than about 5.5. In certain embodiments, the nitrogen-containing silicon carbide layers will be anti-reflective coatings at wavelengths less than about 250 nm.

A preferred dual damascene interconnect structure fabricated in accordance with the invention, i.e., including a low k dielectric film deposited by the processed described above, is shown in FIG. 1. It is recognized that the structure shown in FIG. 1 may be made by other processes than the dual damascene process described herein. For example, methods described in U.S. Pat. No. 6,140,226, entitled, "Dual Damascene Processing for Semiconductor Chip Interconnects," which is incorporated by reference to the extent not inconsistent with the disclosure and claimed aspects of the invention described herein, may be used.

In FIG. 1, the integrated circuit 10 includes an underlying substrate 50, which may include a series of layers deposited thereon and in which a feature 52 has been formed. The feature 52 may be filled with a metal, such as copper. The low k dielectric film of the present invention is deposited over the substrate 50 and the feature 52 to form a barrier layer 54. While the barrier layer 54 shown in FIG. 1 has been patterned, barrier layers that are not patterned may also be formed from the low k dielectric film of the present invention. An intermetal dielectric layer 56 is then deposited on the barrier layer 54. An etch stop layer 58 is deposited on the intermetal dielectric layer 56. The etch stop layer may be formed from the low k dielectric film of the present invention. A second intermetal dielectric layer 60 is then deposited on the etch stop layer 58. The second intermetal dielectric layer 60 may be formed from the same or a different material than the intermetal dielectric layer 56. After the second intermetal dielectric layer 60 is deposited, a dielectric layer 62 is deposited on the second intermetal dielectric layer 60. The dielectric layer 62 may be an anti-reflective coating formed from the low k dielectric film of the present invention. Alternatively, the dielectric layer 62 may be a hard mask formed from the low k dielectric film of the present invention. After the deposition of the dielectric layer 62, one or more photoresist layers (not shown) are deposited to pattern the interconnect openings 64, 66 using conventional photolithography. The layers are then etched using conventional etch processes to form the interconnect openings 64, 66. A liner 68 may be deposited over the sidewalls and fields of the interconnect openings 64, 66 before filling with a conductive metal, such as copper (not shown). Preferably, after the deposition of the metal, the surface of the structure is planarized, such as by chemical mechanical polishing.

While the foregoing is directed to embodiments of the present invention, other and further embodiments of the invention may be devised without departing from the basic scope thereof, and the scope thereof is determined by the claims that follow.

What is claimed is:

1. A method of depositing a low dielectric constant film on a substrate, comprising:

providing a gas mixture to a deposition chamber, wherein the gas mixture comprises a silicon source, a carbon source, and $NR_1R_2R_3$, wherein $R_1$, $R_2$, and $R_3$ are selected from the group consisting of alkyl and phenyl groups;

and reacting the gas mixture while applying radio frequency (RF) power to form a nitrogen-containing silicon carbide layer on the substrate in the deposition chamber.

2. The method of claim 1, wherein an organosilicon compound having the general formula $Si_xC_yH_z$ comprises the silicon source and the carbon source, wherein x has a range of 1 to 2, y has a range of 1 to 6, and z has a range of 4 to 18.

3. The method of claim 2, wherein the organosilicon compound is selected from the group of methylsilane ($SiCH_6$), dimethylsilane ($SiC_2H_8$), trimethylsilane ($SiC_3H_{10}$), tetramethylsilane ($SiC_4H_{12}$), diethylsilane ($SiC_4H_{12}$), and combinations thereof.

4. The method of claim 1, wherein the silicon source is silane and the carbon source is methane.

5. The method of claim 1, wherein the $NR_1R_2R_3$ is trimethylamine.

6. The method of claim 1, wherein the gas mixture further comprises an oxygen source.

7. The method of claim 6, wherein the oxygen source is selected from the group of oxygen, carbon dioxide, and combinations thereof.

8. The method of claim 6, wherein the oxygen source is carbon dioxide.

9. The method of claim 1, wherein the gas mixture further comprises an inert gas.

10. The method of claim 9, wherein the inert gas is selected from the group of helium (He), argon (Ar), neon (Ne), and combinations thereof.

11. The method of claim 1, wherein the ratio of the silicon source to the $NR_1R_2R_3$ in the gas mixture is from about 1:1 to about 1:100.

12. The method of claim 1, wherein the substrate is heated to a temperature from about 150° C. to about 450° C.

13. The method of claim 1, wherein the deposition chamber is maintained at a pressure from about 1 torr to about 15 torr.

14. The method of claim 1, wherein the silicon source and the carbon source are provided to the deposition chamber at a combined rate from about 10 sccm to about 2,000 sccm.

15. The method of claim 1, wherein the $NR_1R_2R_3$ is provided to the deposition chamber at a flow rate from about 50 sccm to about 10,000 sccm.

16. The method of claim 1, wherein the radio frequency power comprises single or mixed radio frequencies.

17. The method of claim 16, wherein the radio frequency power is from about 1 watt/cm$^2$ to about 10 watts/cm$^2$.

18. The method of claim 1, wherein the nitrogen-containing silicon carbide layer has a dielectric constant less than about 5.5.

19. The method of claim 1, wherein the nitrogen-containing silicon carbide layer is an anti-reflective coating (ARC) at wavelengths less than about 250 nm.

20. A low dielectric constant film formed by a method comprising:

providing a gas mixture to a deposition chamber, wherein the gas mixture comprises a silicon source, a carbon source, and $NR_1R_2R_3$, wherein $R_1$, $R_2$, and $R_3$ are selected from the group consisting of alkyl and phenyl groups; and reacting the gas mixture while applying radio frequency power to form a nitrogen-containing silicon carbide layer on a substrate in the deposition chamber.

* * * * *